United States Patent

Yang et al.

[11] Patent Number: 5,578,974
[45] Date of Patent: Nov. 26, 1996

[54] PIEZOELECTRIC FILTER WITH A CURVED ELECTRODE

[75] Inventors: Tsung-Fu Yang; Wei-Shung Huang, both of Taiwan, Taiwan

[73] Assignee: Motorola, Inc., Schaumburg, Ill.

[21] Appl. No.: 431,179

[22] Filed: Apr. 28, 1995

[51] Int. Cl.⁶ .................................................. H03H 9/00
[52] U.S. Cl. ........................... 333/187; 310/365; 333/188
[58] Field of Search ........................... 333/186, 187–192; 310/365, 367

[56] References Cited

U.S. PATENT DOCUMENTS

| | | | |
|---|---|---|---|
| 3,045,744 | 9/1991 | Ando et al. | 310/320 |
| 3,297,968 | 1/1967 | Fowler | 333/187 |
| 3,638,146 | 1/1972 | Takaku | 333/187 |
| 4,070,502 | 1/1978 | Vig et al. | 333/187 |
| 4,127,833 | 11/1978 | Bezemer et al. | 310/367 X |
| 4,257,020 | 3/1981 | Besson | 333/187 |
| 4,471,258 | 9/1984 | Kumada | 310/345 |
| 4,481,488 | 11/1984 | Dworsky | 333/189 |

FOREIGN PATENT DOCUMENTS 0089708  4/1991  Japan .

*Primary Examiner*—Benny Lee
*Assistant Examiner*—Darius Gambino
*Attorney, Agent, or Firm*—Gary J. Cunningham

[57] ABSTRACT

A piezoelectric resonator (10) with an attenuated spurious response. The resonator (10) includes a piezoelectric crystal plate (12) having opposite surfaces (14, 16), electrodes (18, 24) positioned in overlying relationship on each of the opposite surfaces (14, 16), the electrodes (18, 24) being substantially coextensive and opposite, and providing a primary frequency mode of operation and spurious modes upon suitable energization, and one of the electrodes (18, 24) having a curved extension (23) for reducing spurious modes.

8 Claims, 2 Drawing Sheets

PIEZOELECTRIC FILTER WITH A CURVED ELECTRODE

FIELD OF THE INVENTION

This invention relates generally to piezoelectric devices and, in particular, to a piezoelectric resonator or filter for suppression of spurious responses.

BACKGROUND OF THE INVENTION

A monolithic piezoelectric filter is generally defined as a filter whose operations are based on the use of deposited rectangular or square electrode pairs acting as thickness or shear mode resonators or poles separated by nonelectrode regions which act as acoustic coupling elements. The entire filter is on a single quartz blank. The quartz crystal blank or plate forms the most frequency stable type of piezoelectric resonator.

One of the major problems encountered with piezoelectric monolithic filters is the first highest unwanted offband spurious response, clustered around the high-side of the fundamental response or pass-band of the filter. An unbalanced vibration of the quartz crystal plate will normally create this mode of resonance in non-ideal crystal blanks.

The exact level and location of this undesirable unbalanced vibrating plate spurious response (spur), is difficult to predict in advance, before the physical piezoelectric device is actually built because of variations in processing and other limitations in manufacturing capabilities. One of the only ways to reduce this unwanted spurious response is by experimentation.

Hence, there exists a need for an improved arrangement for fabricating piezoelectric monolithic filters, such as quartz crystal blanks, in which the first unwanted offband spurious response can be minimized. Therefore, a structure which helps minimize this first highest off-band spur, would be considered an improvement in the art.

DETAILED DESCRIPTION OF THE PREFERRED EMBODIMENT

Figure 1:
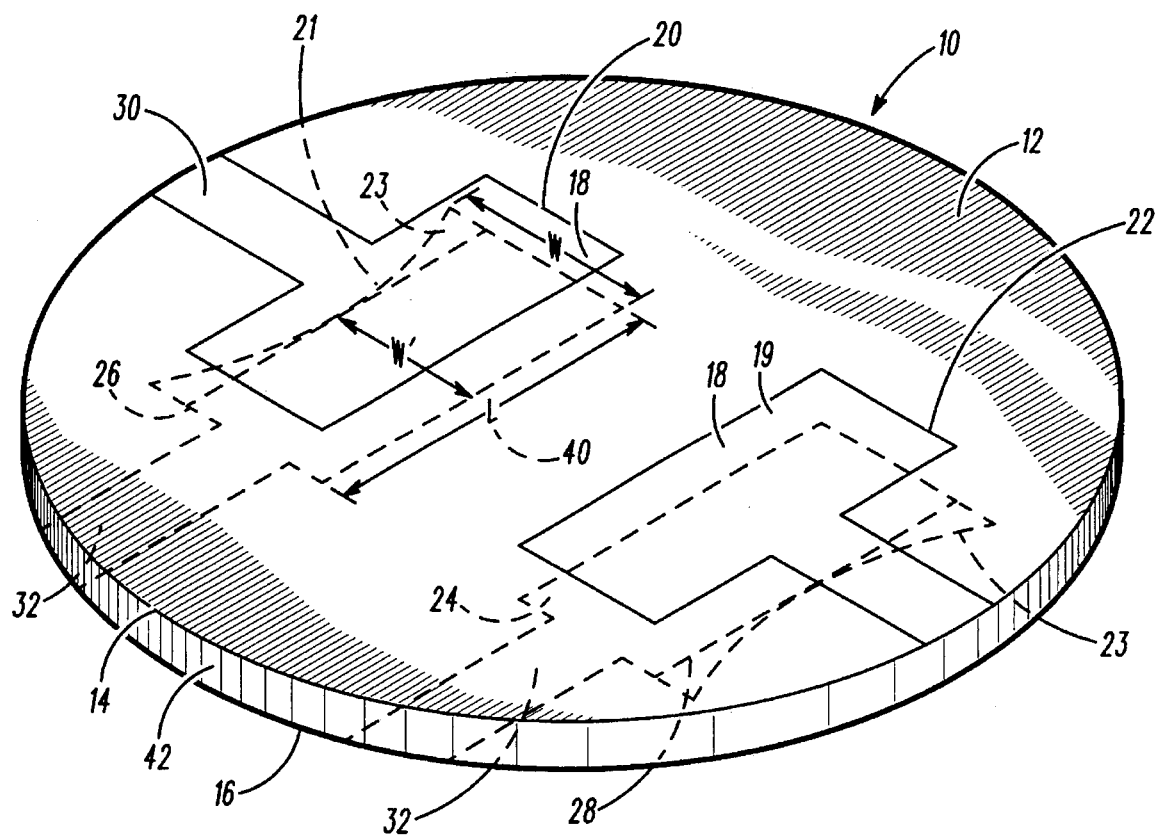
FIG. 1 is a simplified perspective view of a circular crystal blank with a concave extension extending from the rectangular ground electrodes in accordance with the present invention.

In FIG. 1, a piezoelectric resonator 10 with an attenuated first off-band spurious response is shown, in accordance with the present invention. The piezoelectric resonator 10 can be used as a monolithic two-pole filter, for example.

In its simplest form, the resonator 10 includes a piezoelectric crystal plate 12 having opposite top (or "hot" signal side) and bottom (or ground side) surfaces 14 and 16. Two pairs of top (input/output) and bottom (ground) electrodes 18 and 24 are positioned in substantially overlying relationship on each of the first and second (top and bottom) surfaces 14 and 16. Each of the electrodes 18 and 24 includes at least one rectangular portion 19. The rectangular portion 19 has a predetermined length L and a width. Generally, the width is W' if the outer edge of the electrode is curved or a slightly larger W if the outer edge of the electrode is straight.

In many applications, the dimensions of the lengths and widths of the uncurved electrodes are so close to each other that they substantially form squares. In any case, the electrodes 18 and 24 are, substantially coextensive and opposite with each other on the top and bottom surfaces 14 and 16. In addition, a curved or concave extension, side, or opposed end portion 23 having an arc edge 21 is integrally attached or formed with the at least one rectangular portion 19 on at least one of the electrodes 18 and 24. This concave electrode extension 23 can be formed or configured on the first (top) or second (bottom) side surface 14 or 16, and is preferably provided on the bottom (ground) surface 16 and forms one extension of a pair of extensions. More preferably, two concave extensions 23 are symmetrically formed on the ground electrode 24 with the concave ends facing substantially radially and away from each other in an opposed manner, adjacent to the outer periphery of the crystal plate 12. Alternatively, the symmetry can be achieved with the bottom ground electrode 24 on a right side portion 28 being concaved and the top signal electrode 18 on a left side portion being concaved, while the other two electrodes remain substantially straight (rectangular) or vise versa.

Figure 2:
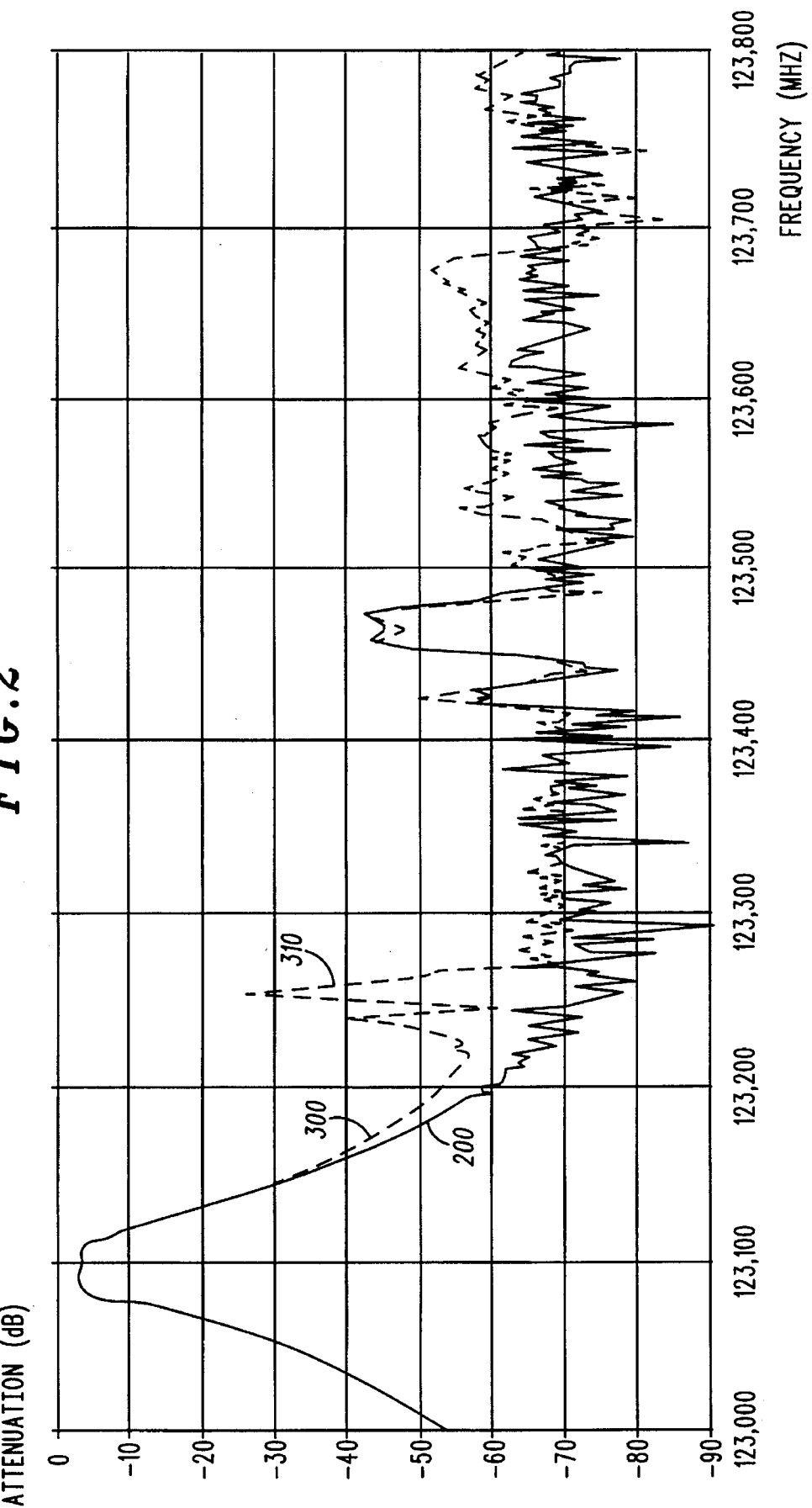
FIG. 2 is a frequency response comparison of a crystal blank with and without the concave ground extensions, in accordance with the present invention.

Upon suitable energization, the piezoelectric resonator 10 provides a primary frequency mode of operation and spurious modes as well. The top and bottom electrodes 18 and 24 each includes tabs 30 and 32, for suitable electrical connection to a power source. The addition of this concave electrode portion 23 can result in reducing the level of spur responses, as illustrated in FIG. 2.

In more detail, the resonator 10 can be in the form of a two-pole monolithic filter. The filter can be improved with the addition of a symmetrical pair of concave electrode portions 23, substantially as shown in FIG. 1. In this embodiment, the filter includes the first (top) rectangular electrode 18 with left and right rectangular sections 20 and 22. Likewise, the second (bottom) electrode 24 on the second surface 16 has left and right sections 26 and 28, extended by a pair of substantially symmetrical concave electrode extensions 23 to form an electroded region.

Piezo spacing 40 between the adjacent left and right sections 20 and 22, left and right sections 26 and 28, and piezo spacing 42 between overlying electrodes 18 and 24, and the area surrounding electrodes 18 and 24, form a surrounding (non-electroded) region. These spacings 40 and 42 comprise quartz or other high-quality piezoelectric material. The thickness or depth of the conductive material of the concave extension 23 is substantially equal to the thickness of the rectangles 18 of the top and bottom electrodes 18 and 24, and these concave and rectangular portions are all integrally connected for ease of manufacturing. The electrodes, including both the rectangular portions or squares 19 and the concave extensions 23, must be made of a conductive material so there is flow of electrical charges to and from the device. For mass production purposes, the concave extensions 23 and electrodes 18 and 24 are made conductive by suitable plating or masking the desired shapes of the electrodes in one step, based on prior experimental results.

As compared to a conventional mask, a mask used in connection with the present invention includes a slightly larger bottom-ground than top (hot) signal electrode area. This slightly larger electrode mask is used to create a square or rectangle L×W comprising a predetermined original area. Thereafter, the original area can be cut or trimmed-away by an arc-trimming process, to form the concave edge having an arc-shape or configuration, to provide a desired aspect ratio (A=L/W') of substantially 1.2.

As another option, the mask of the slightly larger signal and ground electrode area may still be used first, and the slightly larger ground electrode area will be actively trimmed-away during or after frequency response performance testing to form the concave edge and to realize a desired aspect ratio. In a preferred embodiment, the desired mask pattern for forming a concave electrode configuration, can simply be used, without an additional trimming step. This would be accomplished by experience and empirical data.

Independent of how each concave or curved electrode is made, the removal of the curved portion to form the ground (concaved) electrode 24 should be sufficiently small to minimize the introduction of any significant shifts to the device frequency. As illustrated in FIG. 1, each of the concave extensions 23 has an area smaller than one of the electrodes 18 and 24, because each functions as a first highest off-band spur damper. If the concave extensions 23 were larger than the electrodes, they could exhibit their own resonant effects, which may not be particularly desirable in this application.

Experimental results have shown that spur reduction can be achieved with only one curved electrode. In a preferred embodiment, the electrode 26 is configured with two symmetrical extensions 23, for an improved filter design. Other shape variations of the electrode may also reduce the highest off-band spur. However, one of the rules for varying the shape is to watch for the total effective area formed of the electrode. If the electrode is too small, the motional inductance (Lm) will increase and an undesired ripple will appear in the filter response. Hence the optimization of maximum curved electrode area, without undesirable effects, is the target of the present invention.

More particularly, any resonant structure such as a quartz blank with electrodes has a series of natural resonant frequencies which are determined by the nature of the material, the dimensions of the material and any constraints placed on the acoustic system such as the addition or removal of material to the surface. The combination of the basic material and the dimensions of the material gives rise to its natural frequency. AT crystals are made by selecting a particular orientation with respect to the crystallographic axes in quartz and then are fabricated into a thin disk. This shaping enhances the "thickness shear" mode of vibration which is the desired mode of vibration.

A bulk wave piezoelectric device is driven by means of electric field that is created between the device electrodes. The changing electric field is converted into mechanical motion by means of the piezoelectric effect. The arc-trimming process should remove a minimal curved portion from the original square ground metallic electrode 24 such that the electric field between the electrodes is not adversely affected. In general, a rectangular or square electrode will have an aspect ratio A of L/W=1 or a number close to 1, without the concave extensions. Notwithstanding what the original aspect ratio A is, an aspect ratio difference from the uncut original aspect ratio within the range of 0.15 to 0.30 is desired. Having such a small aspect ratio change will contribute to assuring that the motional parameters, such as the motional inductances (Lm) of the device are not significantly negatively influenced. As is known, the motional inductance Lm is inversely proportional to the effective area of the .electrodes. Hence, the motional inductance Lm is an important crystal parameter because all the electrode dimensions will be configured based on this Lm value.

Basically, the more the ground electrode is arc-trimmed to remove more material to form the concave extension, the better will be the attenuation of the first highest unwanted offband spurious response. Since the specific removal of the original electrode area to form the curved electrode may not be ideally predetermined as to what and how certain crystal parameters will exactly change, the material removal is kept to a minimum. For example, in order to minimize the change of the motional inductance Lm, the curvature is formed like an arc 21 where the middle point of the arc is maximally about four mils (W—W' in the x-axis direction) to the edge of the original ground electrode, in one embodiment. On the low end, a width change of two mils could attenuate the first off-band spur in a particular crystal filter, in one embodiment. Note, however that because crystal filter component design is still an art and not a perfect science, manufacturing tolerance compensation may still have to be made in some crystal parameters.

Sometimes to maintain the same value of Lm, the length L (vertical dimension, or y-axis) of the electrodes will have to be enlarged by some length, to compensate for the loss of the curved electrode area. The resultant resonator 10 of FIG. 1, is particularly adapted for minimizing the first highest off-band spur for a two-pole monolithic crystal filter, as seen in FIG. 2.

EXAMPLE 1

Referring to FIG. 2, experimental results of the ground concave electrode change can be seen. FIG. 2 is a plot of attenuation in dB versus frequency in Megahertz (MHz) of a crystal filter substantially shown in FIG. 1. Curve 200 of this plot represents the frequency response of a 123.1 MHz monolithic crystal filter with the concave ground electrodes as shown in FIG. 1. The curved ground electrode structure of the monolithic crystal filter includes concave opposing ends added to the substantially square pair of left and right sections 26 and 28. Specifically, the curved structure corresponding to curve 200 has a particular radius of curvature to form an arc of about four mils at the outer edge of the electrode 24. Other dimensions of the original ground electrode shape may be changed to compensate for the additional concave dimensional shape to maintain a sufficient motional inductance Lm.

COMPARATIVE EXAMPLE A

Curve 300 of a substantially similar filter with rectangular electrodes (without the concave extensions) is shown in broken lines in FIG. 2. It is evident from this plot that the addition of the curved ground electrode has minimized and reduced the presence of the first off-band spurious response 310. At a frequency of approximately 123.254 MHz, an improvement in attenuation of over 40 dB is realized.

Hence, an improved curved electrode arrangement for fabricating piezoelectric monolithic filters is taught, in which the first unwanted offband spurious response is minimized.

What is claimed is:

1. A piezoelectric resonator, comprising:

a piezoelectric crystal plate having two opposite surfaces including a signal surface and a ground surface;

a plurality of electrodes in substantially overlying relationship on each of the opposite surfaces having a substantially rectangular portion having a length and width, and providing a primary frequency mode of operation and a first off-band spurious mode upon suitable energization; and at least one electrode on the ground surface includes an integral electrode extension extending outwardly from the rectangular portion defining a concave end-portion along the length and outer boundary of the electrode on the ground surface a width of the electrode on the ground surface being minimal in proximity to a middle portion of the concave end-portion, to provide attenuation of the first off-band spurious mode.

2. The piezoelectric resonator of claim 1, wherein the electrode on the around surface has at least one electrode including two rectangular portions each rectangular portion having an integral electrode extension facing substantially away from each other in an opposed manner and being adjacent to an outer periphery of the crystal plate.

3. The piezoelectric resonator of claim 1, wherein the integral electrode extension extends substantially outwardly and radially from the substantially rectangular portion of the electrode on the ground surface.

4. The piezoelectric resonator of claim 1, wherein the substantially rectangular portion of the electrode on the ground surface is substantially square.

5. The piezoelectric resonator of claim 1, wherein the integral electrode portion is on the signal surface.

6. The piezoelectric resonator of claim 1, wherein the substantially rectangular portion comprises a trimmed modification of a substantially square portion.

7. The piezoelectric resonator of claim 1, wherein there are two integral electrode extensions which are concave and symmetrically opposed to each other, and each has a predetermined radius of curvature.

8. The piezoelectric resonator of claim 1, wherein at least one of the plurality Of electrodes is on the ground surface and has a left side portion and a right side portion, at least one of the left side and right side portion includes the rectangular portion having a length-to-width aspect ratio of substantially 1.2.

* * * * *